US011029368B2

(12) United States Patent
Eriksen et al.

(10) Patent No.: US 11,029,368 B2
(45) Date of Patent: Jun. 8, 2021

(54) TEST POINT ADAPTOR FOR COAXIAL CABLE CONNECTIONS

(71) Applicant: PPC Broadband, Inc., East Syracuse, NY (US)

(72) Inventors: Kim Eriksen, Tappernøje (DK); Noah Montena, Syracuse, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 0 days.

(21) Appl. No.: 16/459,592

(22) Filed: Jul. 1, 2019

(65) Prior Publication Data

US 2019/0377018 A1    Dec. 12, 2019

Related U.S. Application Data

(63) Continuation of application No. 15/408,355, filed on Jan. 17, 2017, now Pat. No. 10,338,125.

(Continued)

(51) Int. Cl.
*G01R 31/58* (2020.01)
*G01R 31/44* (2020.01)
*H01R 13/52* (2006.01)
(Continued)

(52) U.S. Cl.
CPC ........... *G01R 31/58* (2020.01); *G01R 1/0416* (2013.01); *G01R 31/44* (2013.01); *H01R 13/5219* (2013.01); *G01R 1/06772* (2013.01)

(58) Field of Classification Search
CPC . G01R 31/58; G01R 1/06772; H01R 13/5219
See application file for complete search history.

(56) References Cited

U.S. PATENT DOCUMENTS 3,736,505 A    5/1973  Sankey
4,687,279 A    8/1987  Holland et al.
(Continued)

FOREIGN PATENT DOCUMENTS

WO       2011/079196 A1     6/2011
WO    WO-2011079196 A1 *   6/2011   ............. H01R 39/64

OTHER PUBLICATIONS

Mar. 30, 2017 International Search Report issued in International Application No. PCT/US2017/013825.
(Continued)

*Primary Examiner* — Dominic E Hawkins
(74) *Attorney, Agent, or Firm* — MH2 Technology Law Group LLP

(57) ABSTRACT

A test point adaptor for coaxial cables includes a main body, a test body, and a cap. The main body has a first longitudinal axis and includes a first end comprising a first interface, a second end comprising a second interface, and a first center conductor extending at least from the first interface to the second interface. The test body has a second longitudinal axis arranged transversely to the main body and includes an outer conductive sleeve, a test body end comprising a third interface, an electrically conductive contact member in electrical contact with the first center conductor, and a gripping arrangement electrically coupled with the electrically conductive contact member. The third interface includes a conical contact surface of the outer conductive sleeve. The cap includes a sleeve configured to matingly engage an outer surface of the outer conductive sleeve. The outer conductive sleeve includes a conical contact surface configured to engage the conical contact surface of the outer conductive sleeve when the cap is matingly engaged with the outer sleeve. The cap includes a terminator configured to be aligned with and received by the gripping arrangement,
(Continued)

which electrically couples the terminator to the electrically conductive contact member.

20 Claims, 6 Drawing Sheets

Related U.S. Application Data

(60) Provisional application No. 62/279,613, filed on Jan. 15, 2016.

(51) Int. Cl.
*G01R 1/04* (2006.01)
*G01R 1/067* (2006.01)

(56) References Cited

U.S. PATENT DOCUMENTS

| | | | |
|---|---|---|---|
| 4,797,121 A * | 1/1989 | Hayward | H01R 24/547 439/579 |
| 4,967,173 A | 10/1990 | Watson | |
| 6,205,653 B1 | 3/2001 | Perez et al. | |
| 2002/0125894 A1 | 9/2002 | Madsen et al. | |
| 2002/0135963 A1 | 9/2002 | Pagliuca | |
| 2003/0184404 A1 | 10/2003 | Andrews et al. | |
| 2003/0224657 A1 | 12/2003 | Malloy | |
| 2004/0033721 A1 | 2/2004 | Pocrass | |
| 2004/0152359 A1 * | 8/2004 | Benham | H01R 24/44 439/607.41 |
| 2008/0045080 A1 | 2/2008 | Cook | |
| 2011/0097929 A1 | 4/2011 | Leipold et al. | |
| 2017/0014639 A1 * | 1/2017 | Preston | A61N 5/045 |
| 2018/0372893 A1 * | 12/2018 | Liu | G01V 1/166 |

OTHER PUBLICATIONS

Aug. 21, 2019 Extended European Search Report issued in European Patent Application No. 17739168.7.

* cited by examiner

TEST POINT ADAPTOR FOR COAXIAL CABLE CONNECTIONS

CROSS-REFERENCE TO RELATED APPLICATION

This application is a continuation of U.S. application Ser. No. 15/408,355, filed Jan. 17, 2017, which is a nonprovisional application claims the benefit of U.S. Provisional Application No. 62/279,613, filed on Jan. 15, 2016. The disclosure of the prior applications is hereby incorporated by reference herein in its entirety.

BACKGROUND

Test adaptors or test point adaptors are used in order to test the properties of communication networks such as cable TV and computer networks using, for example, coaxial cables. In order to carry out a test, it is necessary to provide access points in which test equipment may be connected.

Testing of coaxial cables has become increasingly important due to the fact that increasingly more digital signals are carried in the cable. Disturbance in the signal, i.e. the signal/noise ratio, of digital signals is more likely to occur than when only analog signals were use. Thus, ensuring a high quality of the cables including connectors has become increasingly critical. Furthermore, the end user of a connection is increasingly more dependent on the reliability of their connection (e.g., by using IP-telephony, VPN, and similar products) and does not accept line dropout, for example, when their connection is being tested. For example, Internet Service Providers demand increased testing of the lines in order to ensure that they will be able to supply their service with a desired quality of service and without dropouts.

Typically, when inserting test equipment, the coaxial cable is disconnected from, for example, an amplifier or similar equipment that the coaxial cable is connected to. Various components are assembled to achieve an adaptor having an access point for testing, with the adaptor being inserted between the coaxial cable and, for example, an amplifier. In this way, the adaptor provides for testing during use of the cable. One example of such a test point adaptor is described in PCT International Publication Number WO 2011/079196, which is incorporated herein by reference.

In some applications, a test point adaptor may provide an interface for use with test equipment that requires a sliding connection with a port of the test point adaptor, as opposed to a convention threaded connection (e.g., an F-type connection), a bayonet connection, or the like. Similarly, a terminator cap would be slidably connected to the test point adaptor to short the RF signal to the outer conductor. Some conventional sliding connection can be less reliable than threaded connections with respect to preventing escape of the RF signal.

It may thus be desirable to provide a test point adaptor that provides a sliding connection with improved electrical continuity relative to the RF signal. It may be desirable to provide a sliding connection that provides a watertight seal while avoiding possible structural damage to the connection when slidably mating a terminator cap with the test point adaptor.

SUMMARY

According to some aspects of the disclosure, a test point adaptor for coaxial cables includes a main body, a test body, and a cap. The main body has a first longitudinal axis and includes a first end comprising a first interface, a second end comprising a second interface, and a first center conductor extending at least from the first interface to the second interface. The test body has a second longitudinal axis arranged transversely to the main body and includes an outer conductive sleeve, a test body end comprising a third interface, an electrically conductive contact member in electrical contact with the first center conductor, and a gripping arrangement electrically coupled with the electrically conductive contact member. The third interface includes a conical contact surface of the outer conductive sleeve. The cap includes a sleeve configured to matingly engage an outer surface of the outer conductive sleeve. The outer conductive sleeve includes a conical contact surface configured to engage the conical contact surface of the outer conductive sleeve when the cap is matingly engaged with the outer sleeve. The cap includes a terminator configured to be aligned with and received by the gripping arrangement, which electrically couples the terminator to the electrically conductive contact member.

In accordance with various aspects of the disclosure, a test point adaptor for coaxial cables includes a main body, a test body, a cap, and a sealing member. The main body has a first longitudinal axis and includes a first end comprising a first interface, a second end comprising a second interface, and a first center conductor extending at least from the first interface to the second interface. The test body has a second longitudinal axis arranged transversely to the main body and includes an outer conductive sleeve, a test body end comprising a third interface, an electrically conductive contact member in electrical contact with the first center conductor, and a gripping arrangement electrically coupled with the electrically conductive contact member. The cap includes a sleeve configured to matingly engage an outer surface of the outer conductive sleeve. The cap includes a terminator configured to be aligned with and received by the gripping arrangement, which electrically couples the terminator to the electrically conductive contact member. The cap includes an inner surface having an annular groove configured to receive the sealing member. The sealing member is configured to engage an outer surface of the outer conductive sleeve when the cap is matingly engaged with the outer surface of the outer conductive sleeve to provide a watertight connection at the third interface. An endmost region of the outer surface of the outer conductive sleeve has an outside diameter that is smaller than a region of the outer conductive surface that engages the sleeve of the cap. When the cap is coupled with the outer conductive sleeve, the sealing member is configured to engage the outer surface of the outer conductive sleeve to achieve the watertight connection, while the sleeve of the cap does not matingly engage the endmost region of the outer conductive sleeve.

BRIEF DESCRIPTION OF THE DRAWINGS

The present invention is to be described in detail with reference to the accompanying drawings, in which.

DETAILED DESCRIPTION OF EMBODIMENTS

Figure 1:
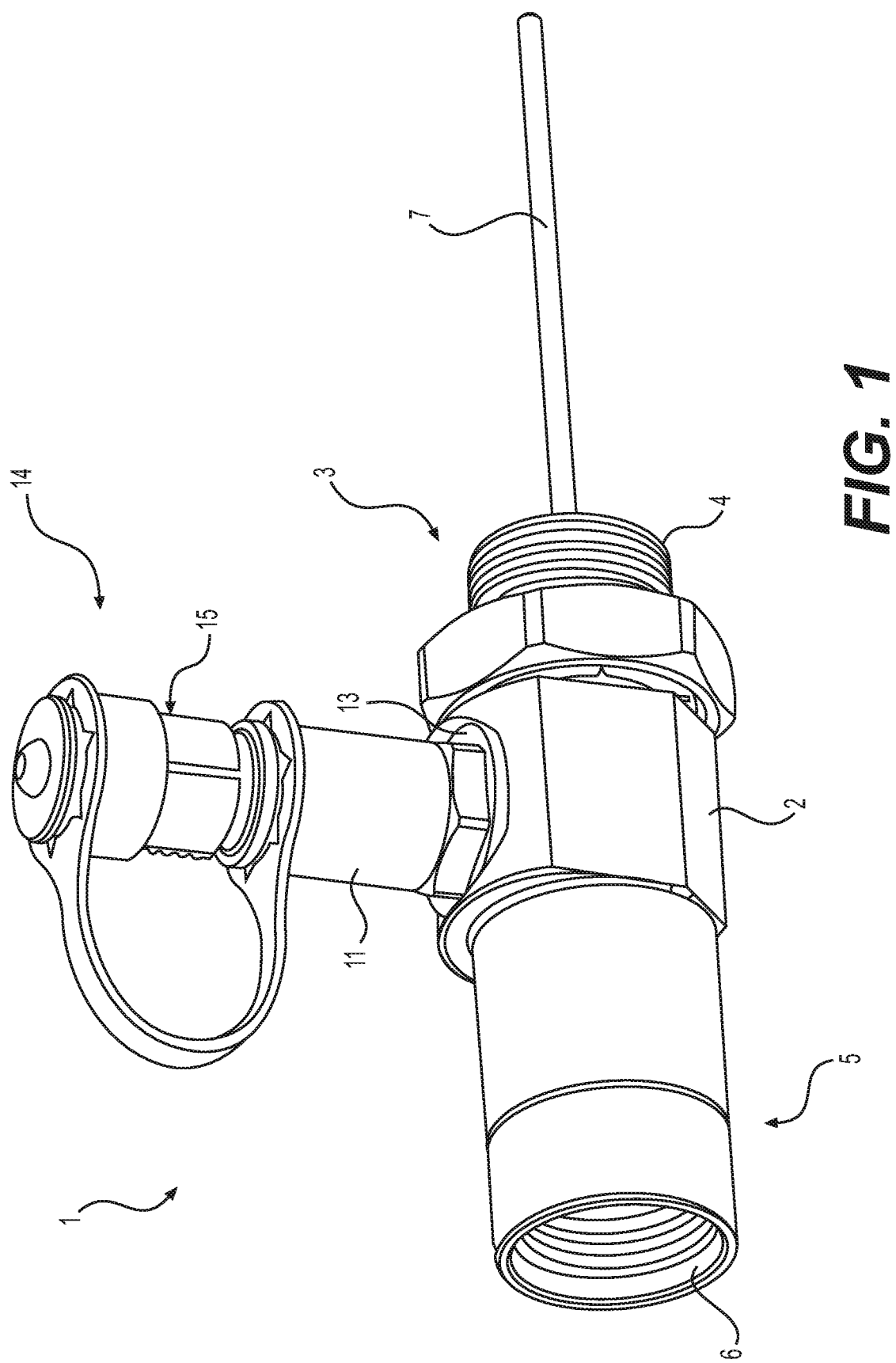
FIG. 1 is a perspective view of an exemplary test point adaptor according to various aspects of the disclosure.

FIG. 1 illustrates an exemplary test point adaptor 1 having a main body 2 and a test body 11 coupled with one another. The main body includes a first end 3 comprising a first interface 4, for example, a swivel member or swivel nut, and a second end 5 comprising a second interface 6. A first center conductor 7 is arranged in the main body 2 extending beyond the first end 3. The test body 11 has a first test body end 13 connected with the main body 2, for example, via a screw connection, and a second test body end 14 comprising a third interface 15. In the illustrated embodiment of the test point adaptor 1, the first interface 4 is a male threaded interface and the second interface 6 is a female threaded interface. However, it should be appreciated that in some embodiments, both of the first and second interfaces 4, 6 may be female threads, both may be male threads, or they may be other kinds of engaging means.

Figure 2:
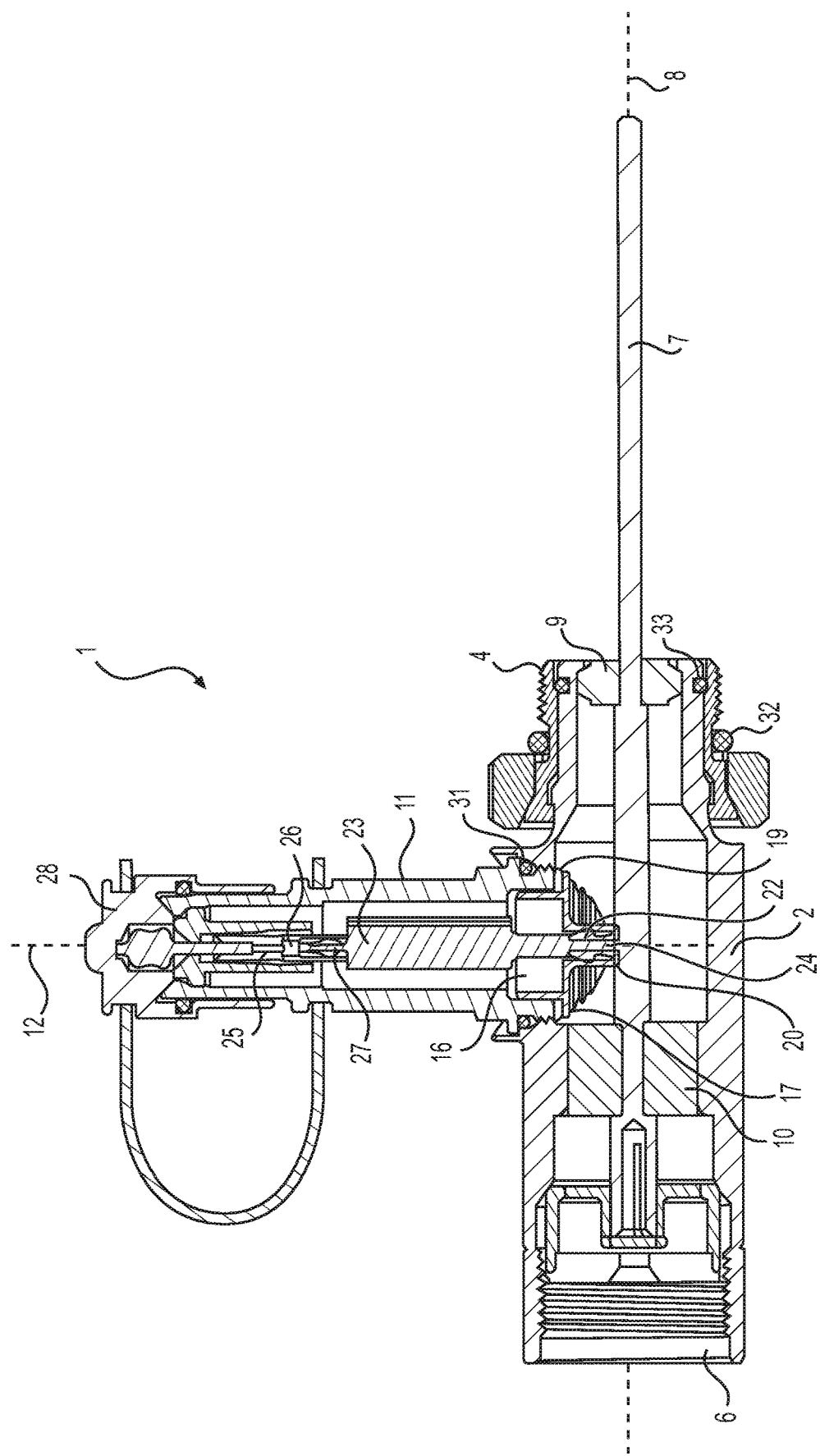
FIG. 2 is a cross sectional view of the exemplary test point adaptor of FIG. 1.

Referring now to FIG. 2, the first center conductor 7 is arranged along a longitudinal axis 8 of the main body 2. The first center conductor 7 is kept substantially in the center of the main body 2 by a first seizure 9 and a second seizure 10. The test body 11 is coupled with the main body 2 such that a longitudinal axis 12 of the text body 11 is substantially perpendicular to the longitudinal axis 8 of the main body 2. It should be appreciated that the test body 11 may be coupled with the main body 2 in other ways than substantially perpendicular to the main body 2, for example, at an angle such as 15°-90°, such as 25°-80°, such as 35°-70°, or such as 35°-55°.

As mentioned above, the first test body end 13 of the test body 11 may be threadably coupled with the main body 2. A seizure 16 is mounted at the first test body end 13. The seizure 16 is provided with an annular projection 17. A spring 19 is arranged between the annular projection 17 of the seizure 16 and an end rim 18 of the first test body end 13. The seizure 16 is arranged so as to be able to move along the longitudinal axis 12 of the test body 11. The spring 19, for example, an annular spring washer, biases the seizure 16 along the longitudinal axis 12 of the test body 11 in the direction away from the second end 14 of the test body 11.

A contact member 20 is inserted in a central seizure aperture 21 of the seizure 16. The contact member 20 is provided with a central aperture 22 for receiving a first end 24 of a resistor 23 or similar. Having positioned the first resistor end 24 in the central aperture 21 of the seizure 16, the central aperture 22 of the contact member 20 is arranged to receive the first resistor end 24. When the contact member 20 is inserted in the central aperture 21 of the seizure 16, the contact member 20 clamps around the first resistor end 24. Thus, the first resistor end 24 is kept in position and the contact member 20 is fixed in the central aperture of the seizure 16. As the contact member 20 is electrically conductive, the resistor 23 is in electrical contact with objects being in contact with the contact member 20.

The resistor 23 extends internally in the test body 11 along the longitudinal axis 12. At the second end 14 of the test body 11, the resistor 23 is kept in position by a gripping arrangement 25. The gripping arrangement 25 is provided with a central aperture 26. The central aperture 26 of the gripping arrangement 25 is arranged so as to receive a second end 27 of the resistor 23. The gripping arrangement 25 is electrically conductive so as to facilitate that the center pin of test equipment (not shown) may be inserted into the test body 11 in electrical contact with the resistor 23.

The second end 14 of the test body 11 is terminated by a removable cap 28 comprising a terminator 29, for example, a resistor, between a signal and ground. The terminator 29 is configured to provide electrical termination of a signal to prevent an RF signal from being reflected back from the second end 14 of the test body 11, causing interference. The cap 28 is slidably coupled with the third interface 15 of the second end 14 of the test body 11. Further, in order to achieve watertight connections, the test point adaptor 1 is provided with sealing members 31, 32, 33, for example, O-rings.

Figure 3:
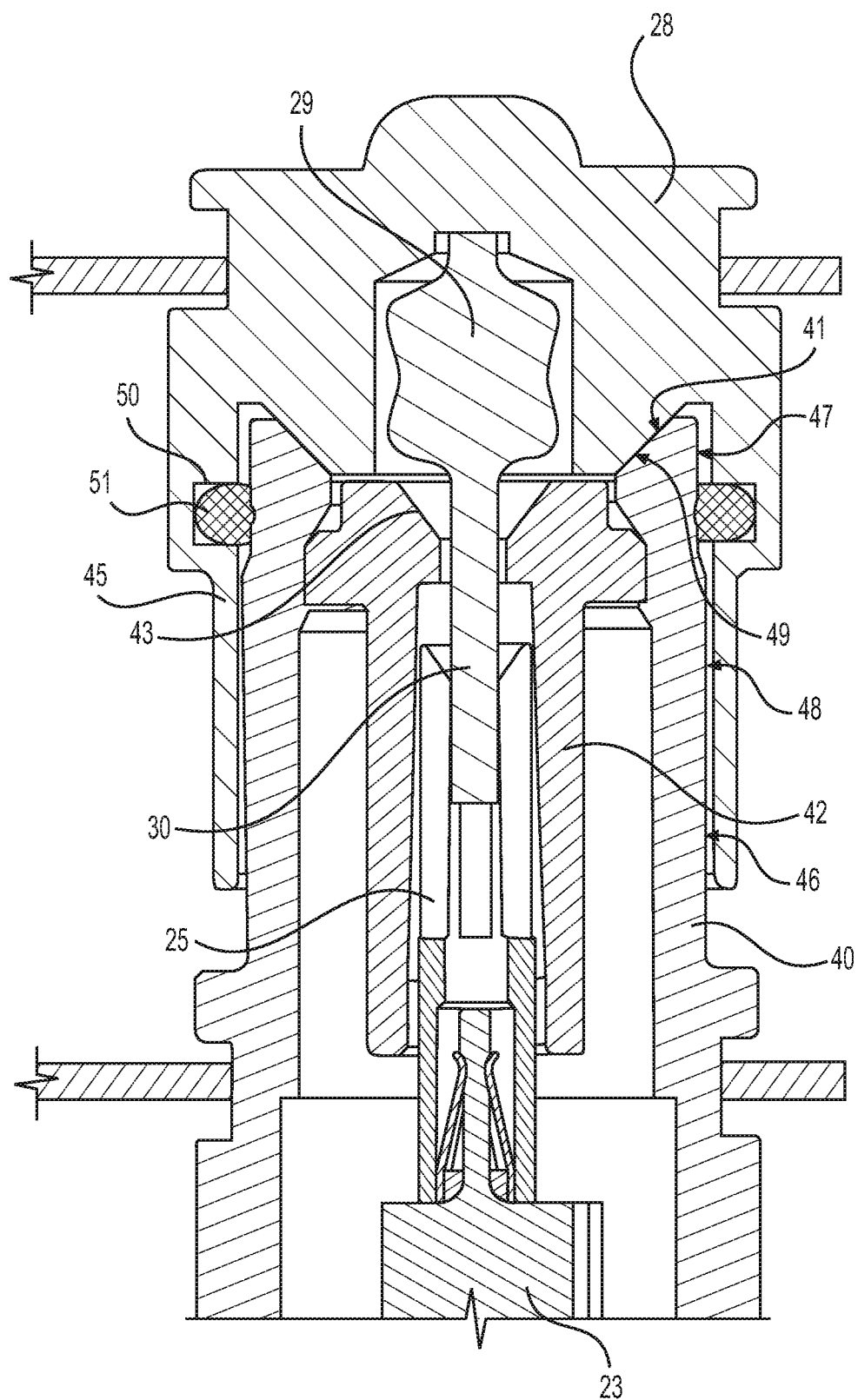
FIG. 3 is an enlarged cross-sectional view of a second end of the test body and cap of the exemplary test point adaptor of FIG. 1.
Figure 4:
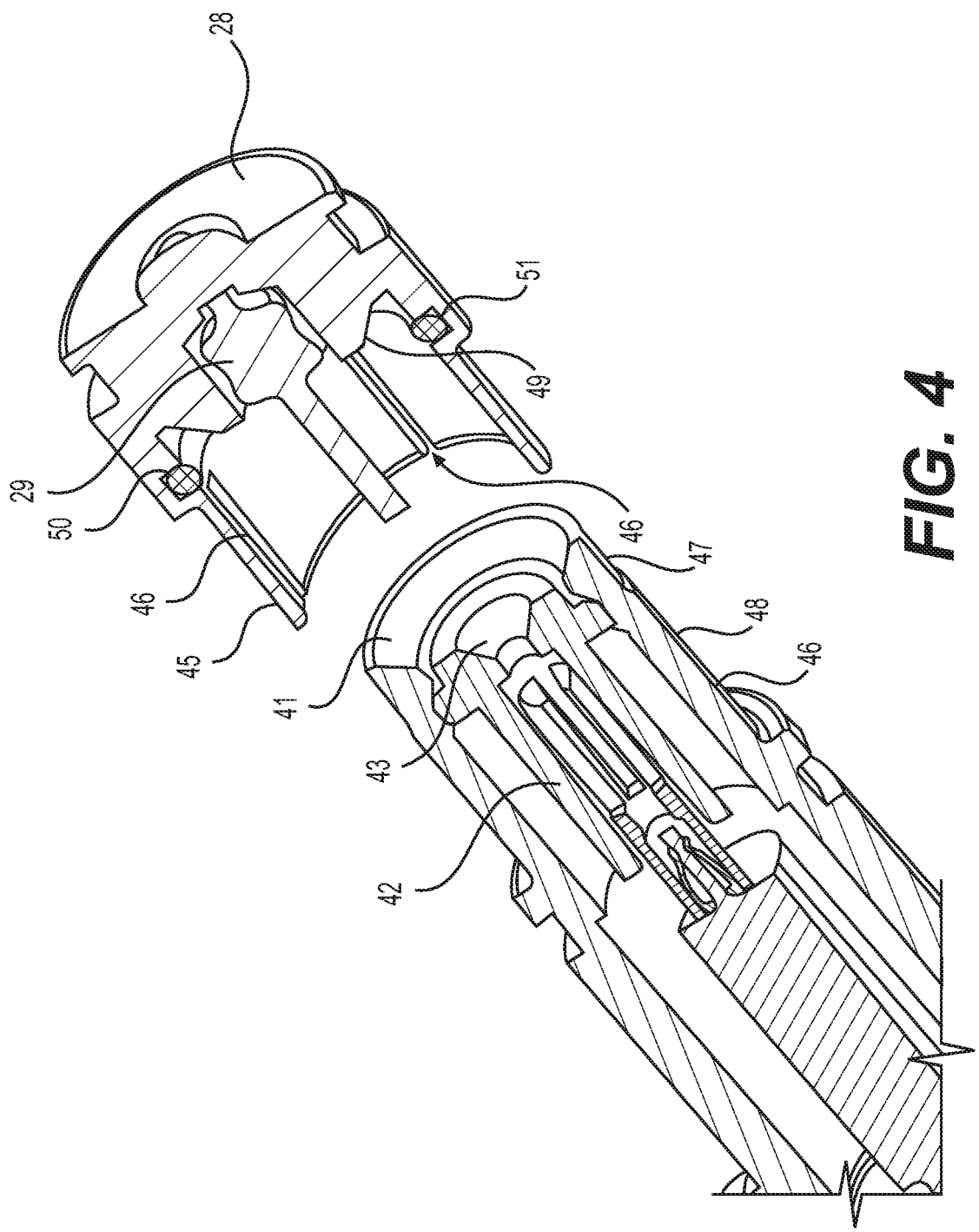
FIG. 4 is a perspective view of the cross-section of the second end of the test body of the exemplary test point adaptor shown in FIG. 3 with the cap removed.

Referring now to FIGS. 3 and 4, the test body 11 includes an outer conductive sleeve 40 having a conical contact surface 41 at the third interface 15. The third interface 15 also includes a nonconductive sleeve 42, for example, a plastic sleeve, concentrically coupled with the outer conductive sleeve 40 and surrounds the gripping arrangement 25 within the test body 11. The nonconductive sleeve 42 is mechanically coupled with the outer sleeve 40 such that the sleeves 40, 42 are not axially slidable relative to one another. The nonconductive sleeve 42 includes a tapered opening 43 configured to assist with insertion of a lead 30 of the terminator 29 into the central aperture 26 of the gripping arrangement 25. It should be understood that the gripping arrangement 25 may comprise a slotted sleeve, prongs, or any other gripping member that is capable of maintaining a forcible connection so as to ensure electrical continuity between the resistor 23 and either the terminator 29 or test equipment (not shown).

As best illustrated in FIG. 4, the cap 28 includes a sleeve 45 configured to matingly engage an outer surface 46 of the outer conductive sleeve 40. The sleeve 45 of the cap 28 includes slots 46 extending in the direction of the longitudinal axis 12. As a result of the slots 46, the cap sleeve 45 can be manufactured with an inside diameter that is slightly smaller than the outside diameter of the outer sleeve 40. Thus, when the cap sleeve 45 is slidably coupled with the outer sleeve 40, the cap sleeve 45 is expanded to receive the outer sleeve 40, and the cap sleeve 45 provides a biasing force against the outer sleeve 40 to provide electrical continuity between the cap 28 and the outer conductive sleeve 40.

The cap 28 also includes an annular groove 50 in an inner surface of the cap sleeve 45. The annular groove 50 is configured to receive a sealing member 51, for example, an O-ring. The sealing member 51 is configured to engage the outer surface 46 of the outer conductive sleeve 40 when the cap 28 is matingly engaged with the outer surface 46 of the outer sleeve 40 to ensure a watertight connection at the third interface 15. As shown in FIGS. 3 and 4, an endmost region 47 of the outer surface 46 of the outer sleeve 40 may have an outside diameter that is smaller than a region 48 of the outer surface 46 that engages the cap sleeve 45. As a result, when the cap 28 is coupled with the outer sleeve 40, the sealing member 51 may be configured to engage the outer surface 46 to achieve the watertight connection, while the cap sleeve 45 will not matingly engage the endmost region 47 to avoid possible damage to and/or deterioration of the connection.

The cap 28 also includes a conical contact surface 49 configured to engage with the conical contact surface 41 of the outer conductive sleeve 40 when the cap 28 is matingly engaged with the outer sleeve 40. The conical contact surfaces 41, 49 provide a longer engagement interface between the cap 28 and the outer sleeve 40 than conventional caps that provide radial (i.e., non-conical) contact surfaces. Thus, the RF signal is less likely to escape at the third interface, despite only providing a sliding connection between the cap 28 and the outer sleeve 40 (i.e., instead of a threaded connection). Although FIGS. 3 and 4 illustrate the conical contact surface 40 tapering radially inward and the conical contact surface 49 tapering radially outward, it should be understood that in some embodiments, the conical contact surface 40 may taper radially outward and the conical contact surface 49 may taper radially inward.

The described embodiment of the test body 11 and its components provide electrical contact between a test instrument (not shown) connected at the second end 14 of the test body 11, which is in turn electrically connected with the contact member 20. The contact member 20 is in contact with the first center conductor 8 arranged in the main body 2. Further details of the seizure 16, the contact member 20, the spring 19, and other features of the test point adaptor 1, as well as mounting of the test point adaptor 1 on a component, are described in PCT International Publication Number WO 2011/079196, which is incorporated herein by reference.

Figure 5:
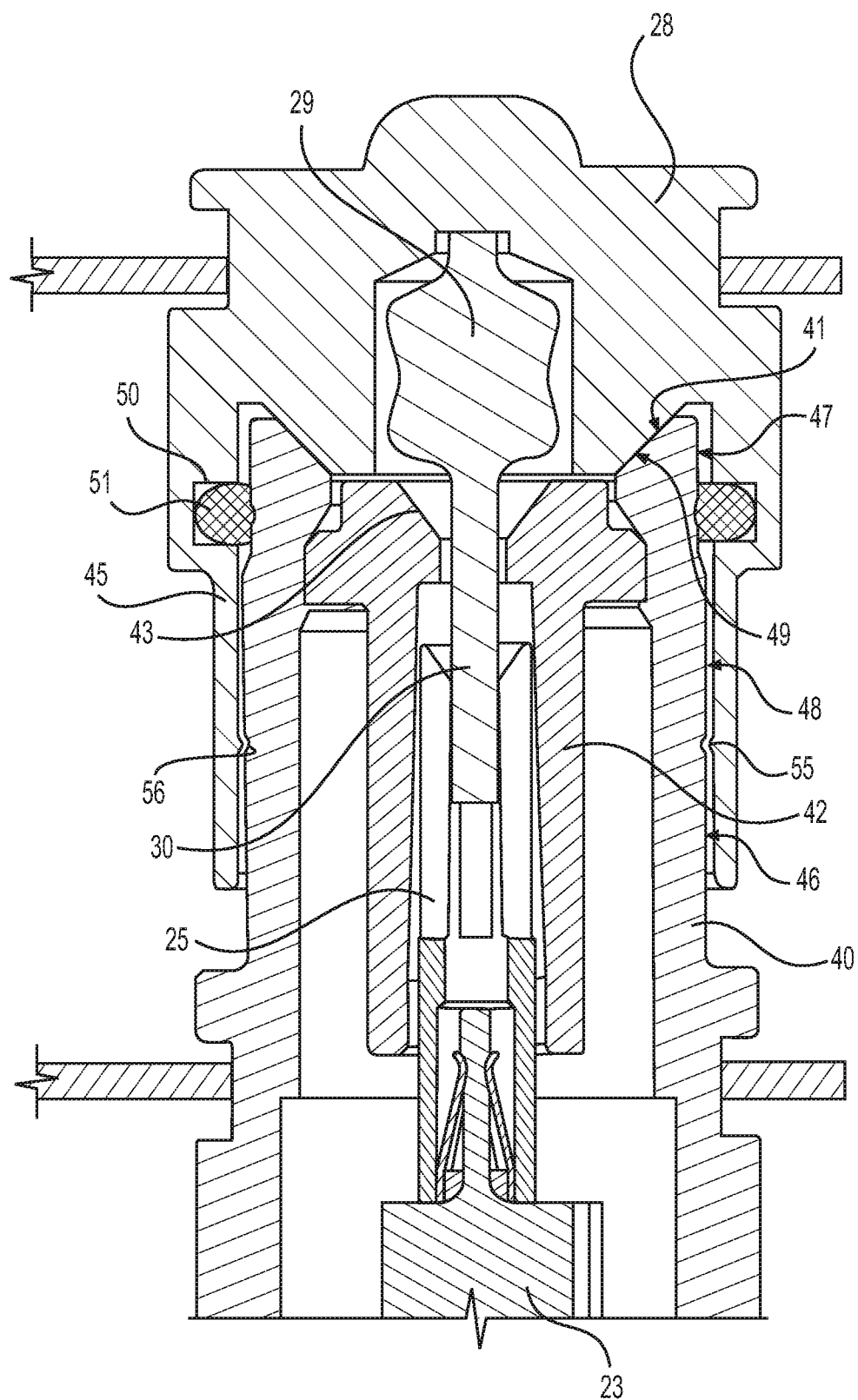
FIG. 5 is an enlarged cross-sectional view of an alternative second end of the test body and cap of FIG. 3.

Referring to FIG. 5, in some aspects of the test point adaptor 1, the outer cap sleeve 45 may include an annular ridge 55 (or a series of intermittent ridges arranged annularly). The region 48 of the outer surface 46 of the outer conductive sleeve 40 that engages the cap sleeve 45 may include an annular groove 56 that is configured to matingly receive the annular ridge 55. The annular ridge 55 and the annular groove 56 may be positioned on the cap sleeve 45 and outer sleeve 40, respectively, to provide a positive connection force between the cap sleeve 45 and the outer sleeve 40. As a result, the conical contact surfaces 41, 49 are urged against one another with a force when the cap sleeve 45 and the outer sleeve 40 are matingly connected to ensure electrical continuity. The annular ridge 55 and the annular groove 56 may provide tactile feedback to a user as to when the cap sleeve 45 and the outer sleeve 40 are matingly connected and may also help prevent the cap sleeve 45 and the outer sleeve 40 from sliding apart.

Figure 6:
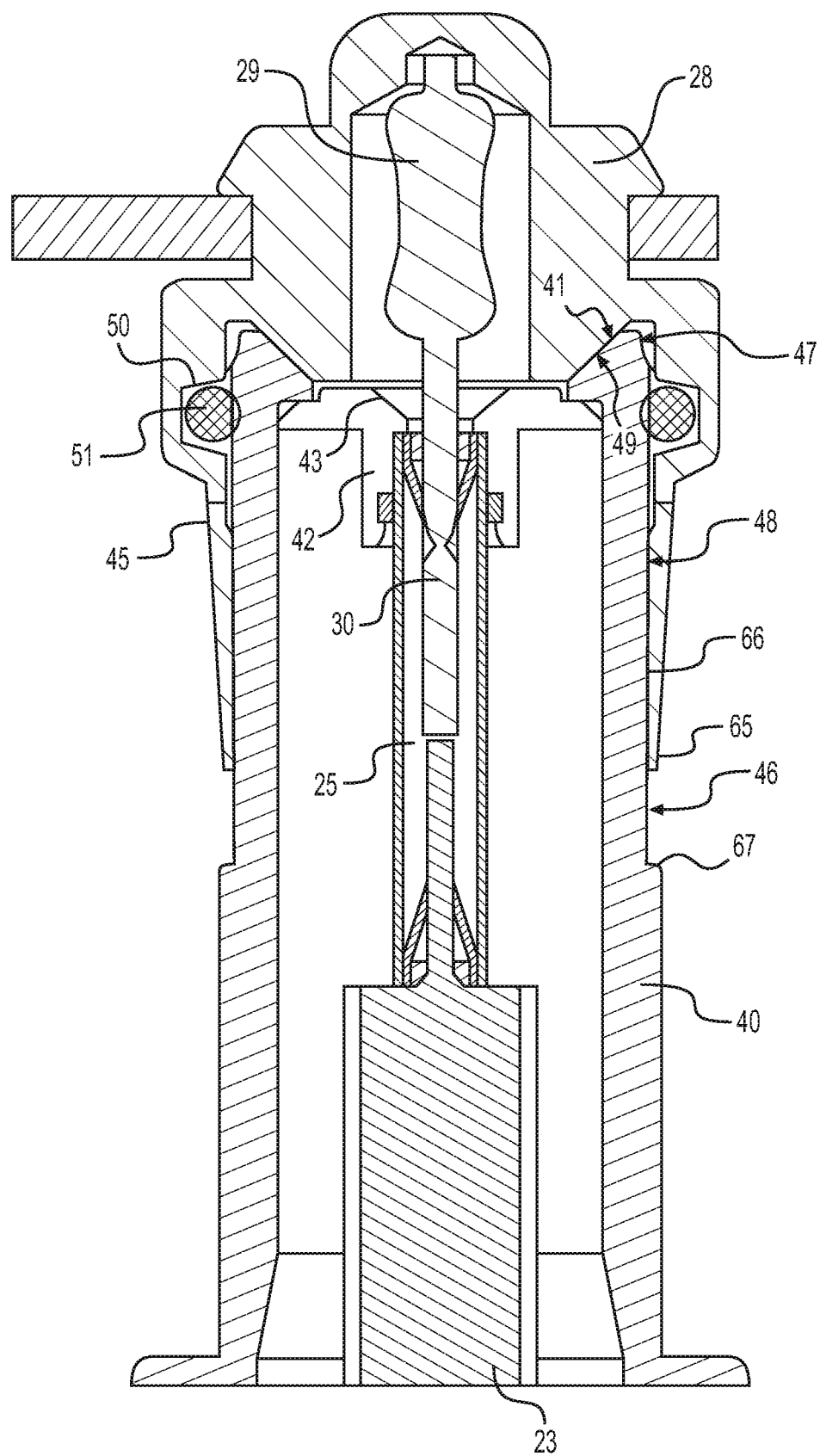
FIG. 6 is an enlarged cross-sectional view of another alternative second end of the test body and cap of FIG. 3.

Referring now to FIG. 6, in some aspects of the test point adaptor 1, the outer sleeve 40 may include a tapered outer surface. For example, the outer surface 40 may be tapered from point 66 toward a shoulder 67 of the outer sleeve 40. That is, the outside diameter of the outer sleeve 45 may taper from point 66 to shoulder 67. As discussed above, the cap sleeve 45 can be manufactured with an inside diameter that is slightly smaller than the outside diameter of the outer sleeve 40. For example the cap sleeve may have an inside diameter that is slightly smaller than the outside diameter of the outer sleeve 40 at a point along the outer sleeve 40 that is between point 66 and shoulder 67. Thus, when the cap sleeve 45 is slidably coupled with the outer sleeve 40, the cap sleeve 45 is expanded to receive the outer sleeve 40, and the cap sleeve 45 provides a biasing force against the tapered region of the outer sleeve 40 to provide electrical continuity between the cap 28 and the outer conductive sleeve 40. As a result, the conical contact surfaces 41, 49 are urged against one another with a force when the cap sleeve 45 and the outer sleeve 40 are matingly connected to ensure electrical continuity. The tapered region of the outer sleeve 40 may cooperated with the cap sleeve 45 to help prevent the cap sleeve 45 and the outer sleeve 40 from sliding apart.

Additional embodiments include any one of the embodiments described above, where one or more of its components, functionalities or structures is interchanged with, replaced by or augmented by one or more of the components, functionalities or structures of a different embodiment described above.

It should be understood that various changes and modifications to the embodiments described herein will be apparent to those skilled in the art. Such changes and modifications can be made without departing from the spirit and scope of the present disclosure and without diminishing its intended advantages. It is therefore intended that such changes and modifications be covered by the appended claims.

Although several embodiments of the disclosure have been disclosed in the foregoing specification, it is understood by those skilled in the art that many modifications and other embodiments of the disclosure will come to mind to which the disclosure pertains, having the benefit of the teaching presented in the foregoing description and associated drawings. It is thus understood that the disclosure is not limited to the specific embodiments disclosed herein above, and that many modifications and other embodiments are intended to be included within the scope of the appended claims. Moreover, although specific terms are employed herein, as well as in the claims which follow, they are used only in a generic and descriptive sense, and not for the purposes of limiting the present disclosure, nor the claims which follow.

What is claimed is:

1. A test point adaptor for coaxial cables, comprising:
a main body having a first longitudinal axis, said main body including:
a first end comprising a first interface,
a second end comprising a second interface, and
a center conductor extending at least from the first interface to the second interface;
a test body having a second longitudinal axis arranged transversely to the main body, said test body including:
an outer conductive sleeve,
a test body end comprising a third interface,
an electrically conductive contact member in electrical contact with the center conductor, and
a gripping arrangement electrically coupled with the electrically conductive contact member; and
a cap including
a sleeve configured to matingly engage an outer surface of the outer conductive sleeve,
a terminator configured to be aligned with and received by the gripping arrangement, which electrically couples the terminator to the electrically conductive contact member, and
wherein the sleeve of the cap is configured to provide a biasing force against the outer conductive sleeve to provide electrical grounding between the cap and the outer conductive sleeve.

2. The test point adaptor of claim 1, wherein the third interface includes a conical contact surface of the outer conductive sleeve, the cap including a conical contact surface configured to engage the conical contact surface of the outer conductive sleeve when the cap is matingly engaged with the outer conductive sleeve.

3. The test point adaptor of claim 2, wherein the third interface further includes a nonconductive sleeve concentrically coupled with the outer conductive sleeve and surrounding the gripping arrangement within the test body.

4. The test point adaptor of claim 3, wherein the nonconductive sleeve includes a tapered opening configured to assist with insertion of a portion of the terminator into a central aperture of the gripping arrangement.

5. The test point adaptor of claim 1, wherein the sleeve of the cap includes slots extending in the direction of the second longitudinal axis.

6. A test point adaptor for coaxial cables, comprising:
a main body having a first longitudinal axis extending from a first end to a second end and a center conductor extending along the first longitudinal axis;
a test body having a second longitudinal axis arranged transversely to the first longitudinal axis, the test body including:
an outer conductive sleeve,
a test body end comprising an interface, the interface including a conical contact surface of the outer conductive sleeve,
an electrically conductive contact member in electrical contact with the center conductor, and
a gripping arrangement electrically coupled with the electrically conductive contact member; and
a cap including
a sleeve configured to matingly engage an outer surface of the outer conductive sleeve, the cap including a conical contact surface configured to engage the conical contact surface of the outer conductive sleeve when the cap is matingly engaged with the outer conductive sleeve, and
a terminator configured to be aligned with and received by the gripping arrangement, which electrically couples the terminator to the electrically conductive contact member,
wherein the sleeve is configured to provide a biasing force against the outer conductive sleeve to provide electrical grounding between the cap and the outer conductive sleeve.

7. The test point adaptor of claim 6, wherein the interface further includes a nonconductive sleeve concentrically coupled with the outer conductive sleeve and surrounding the gripping arrangement within the test body portion.

8. The test point adaptor of claim 7, wherein the nonconductive sleeve includes a tapered opening configured to assist with insertion of a portion of the terminator into a central aperture of the gripping arrangement.

9. A test point adaptor for coaxial cables, comprising:
a main body portion having a first end and a second end along a first longitudinal axis;
a test body portion including an outer conductor sleeve having a second longitudinal axis arranged transversely to the first longitudinal axis; and
a cap including a sleeve portion and a terminator portion,
wherein the main body portion is configured to have center conductor configured to extend though the main body portion along the first longitudinal axis;
wherein the test body portion is configured to have an interface at an end of the test body portion, the end of the test body portion being configured to include a conical contact surface of the outer conductive sleeve;
wherein the cap is configured to matingly engage the interface of the test body portion; and
wherein the sleeve of the cap is configured to provide a biasing force against the outer conductive sleeve to provide electrical grounding between the cap and the outer conductive sleeve.

10. The test point adaptor of claim 9, wherein the interface further includes a nonconductive sleeve concentrically coupled with the outer conductive sleeve and surrounding the gripping arrangement within the test body portion.

11. The test point adaptor of claim 10, wherein the nonconductive sleeve includes a tapered opening configured to assist with insertion of a portion of the terminator into a central aperture of the gripping arrangement.

12. The test point adaptor of claim 9, wherein the sleeve of the cap includes slots extending in the direction of the second longitudinal axis.

13. The test point adaptor of claim 9, further comprising a sealing member, wherein the cap includes an inner surface having an annular groove configured to receive the sealing member.

14. The test point adaptor of claim 13, wherein the sealing member is configured to engage an outer surface of the outer conductive sleeve when the cap is matingly engaged with the outer surface of the outer conductive sleeve to provide a watertight connection at the interface.

15. The test point adaptor of claim 14, wherein an endmost region of the outer surface of the outer conductive sleeve has an outside diameter that is smaller than a region of the outer conductive surface that engages the sleeve of the cap.

16. The test point adaptor of claim 15, wherein, when the cap is coupled with the outer conductive sleeve, the sealing member is configured to engage the outer surface of the outer conductive sleeve to achieve the watertight connection, while the sleeve of the cap does not matingly engage the endmost region of the outer conductive sleeve.

17. The test point adaptor of claim 9, wherein when the cap is matingly engaged with the outer conductive sleeve, the conical contact surface of the cap and the conical contact surface of the outer conductive sleeve engage with one another to provide an engagement interface that is longer than a radial dimension of the outer conductive sleeve.

18. The test point adaptor of claim 9, wherein the test body portion is configured to include an electrically conductive contact member in electrical contact with the center conductor and a gripping arrangement electrically coupled with the electrically conductive contact member.

19. The test point adaptor of claim 18, wherein the cap is configured to include a conical contact surface configured to engage the conical contact surface of the outer conductive sleeve when the cap is matingly engaged with the interface of the test body portion and a terminator portion configured to be received by the gripping arrangement.

20. The test point adaptor of claim 18, wherein the gripping arrangement is configured to electrically couple the terminator to the electrically conductive contact member.

* * * * *